(12) United States Patent
Tsai et al.

(10) Patent No.: US 6,831,013 B2
(45) Date of Patent: Dec. 14, 2004

(54) METHOD OF FORMING A DUAL DAMASCENE VIA BY USING A METAL HARD MASK LAYER

(75) Inventors: Teng-Chun Tsai, Hsin-Chu (TW); Chia-Lin Hsu, Taipei (TW)

(73) Assignee: United Microelectronics Corp. (TW)

( * ) Notice: Subject to any disclaimer, the term of this patent is extended or adjusted under 35 U.S.C. 154(b) by 269 days.

(21) Appl. No.: 09/986,929

(22) Filed: Nov. 13, 2001

(65) Prior Publication Data

US 2003/0092279 A1 May 15, 2003

(51) Int. Cl.[7] .............................................. H01L 21/302
(52) U.S. Cl. .................. 438/687; 438/624; 438/717; 438/725; 438/736; 438/740
(58) Field of Search ................... 438/740, 704, 438/725, 692, 717, 736, 687, 624

(56) References Cited

U.S. PATENT DOCUMENTS

| 6,638,871 B2 | * 10/2003 | Wang et al. ................. 438/694 |
| 2001/0030169 A1 | * 10/2001 | Kitagawa et al. ............. 216/17 |
| 2003/0190829 A1 | * 10/2003 | Brennan ..................... 439/200 |

* cited by examiner

*Primary Examiner*—George A. Goudreau

(57) ABSTRACT

This invention relates to a method of forming a dual damascene via, in particular to a method of forming a dual damascene via by using a metal hard mask layer. The present invention uses a metal layer to be a hard mask layer to make the surface of the isolation layer become a level and smooth surface and not become a rounding convex and to prevent the via being connected with others vias to cause the leakage defects after forming the shape of the via.

36 Claims, 7 Drawing Sheets

METHOD OF FORMING A DUAL DAMASCENE VIA BY USING A METAL HARD MASK LAYER

BACKGROUND OF THE INVENTION

1. Field of the Invention

This invention relates to a method of forming a dual damascene via, in particular to a method of forming a dual damascene via by using a metal hard mask layer to prevent the via being connected with others vias to cause the leakage defects after forming the shape of the via.

2. Description of the Prior Art

In the manufacturing of devices on a semiconductor wafer, it is now the practice to fabricate multiple levels of conductive (typically metal) layers above a substrate. The multiple metallization layers are employed in order to accommodate higher densities as device dimensions shrink well below the one-micron design rules. Likewise, the size of inter-connective structures will also need to shrink, in order to accommodate the smaller dimensions. Thus, as integrated circuit technology advances into the sub-0.25 micron range, more advanced inter-connective architecture and new materials are required.

One such architecture is a dual damascene integration scheme in which a dual damascene structure is employed. The dual damascene process offers the advantage in process simplification by reducing the process steps required to form the vias and trenches for a given metallization level. The openings, for the wiring of a metallization level and the underlying via connecting the wiring to a lower metallization level, are formed at the same time. The procedure provides an advantage in lithography and allows for improved critical dimension control. Subsequently, both the via and the trench can be filled utilizing the same metal-filling step, thereby reducing the number of processing steps required. Because of the simplicity of the dual damascene process, newer materials can cost-effectively replace the use of the existing aluminum (Al)/SiO$_2$ (silicon dioxide) scheme.

Referring to FIG. 1, this shows a diagram in forming the shape of the dual damascene via by using the traditional method. When the dual damascene via is formed by using the traditional method, a wafer, which comprises the first metal layer 10, a cap layer 20, the first low dielectric constant dielectric layer 30, a middle etching stop layer 40, the second low dielectric constant dielectric layer 50, the first hard mask layer 60, and the second hard mask layer 70, is must provided at first. The second step is to decide a location of an isolation layer on the second hard mask layer 70 and to form the second hard mask layer 70 on the isolation layer by using a photolithography and a etching procedure to remove the partial second hard mask layer 70. The third step is to form the first trench in the second low dielectric constant dielectric layer 50 and the middle etching stop layer 40 by using the photolithography and the etching procedure to remove the partial middle etching stop layer 40 and the partial second low dielectric constant dielectric layer 50. The fourth step is to form the second trench in the first low dielectric constant dielectric layer 30 and the cap layer 20 by using the photolithography and the etching procedure to remove the partial first low dielectric constant dielectric layer 30, the partial middle etching stop layer 40, and the partial cap layer 20. The first trench and the second trench can be connected with each other to become the shape of the dual damascene via. The isolation layer, which is used to isolate the dual damascene via, is combined by using the middle etching stop layer 40, the second low dielectric constant dielectric layer 50, the first hard mask layer 60, and the second hard mask layer 70.

Referring to FIG. 2, after forming the shape of the dual damascene via on the wafer, a metal layer 80 is formed in the dual damascene via and filled of the dual damascene via. Then the surface of the wafer will become a planar surface by proceeding a chemical mechanical polishing procedure and the dual damascene via procedure is finished.

In the traditional dual damascene via procedure, in order to prevent the first low dielectric constant dielectric layer 30 and the second low dielectric constant dielectric layer 50 being affected by the stress, which is produced in the chemical mechanical polishing procedure, to cause the deformation defect or contacting with the slurry directly to change properties of the first low dielectric constant dielectric layer 30 and the second low dielectric constant dielectric layer 50, there are one to three dielectric layers must being formed on the second low dielectric constant dielectric layer 50 to eliminate the influence of the stress and to avoid the changes of the properties. These one to three dielectric layers are the first hard mask layer 60 and the second hard mask layer 70. But in the present procedure, the selective etching rate among the first hard mask layer 60, the second hard mask layer 70, the first low dielectric constant dielectric layer 30, and the second low dielectric constant dielectric layer 50 is not enough. Therefore, the first hard mask layer 60 and the second hard mask layer 70 will usually have the rounding profile after finishing the etching procedures from the second step to the fourth step. This rounding profile will decrease the distance between the dual damascene vias and decrease the process window in the back-end chemical mechanical polishing procedure. This rounding profile will also produce the bridging defect between the dual damascene vias more easily to cause the leakage defect. This rounding profile will further decrease the qualities of the semiconductor device and will increase the cost of the procedure.

SUMMARY OF THE INVENTION

In accordance with the background of the above-mentioned invention, the traditional method will produce the rounding profile on the surface of the isolation layer easily to affect the process window of the back-end procedure and to produce the bridging defect between the dual damascene vias easily to cause the leakage defect. The present invention provides a method of forming the dual damascene via by using the metal layer to be the hard mask layer to make the surface of the isolation layer, which is between the dual damascene vias, become a level and smooth surface to avoid the bridging defect, which is produced between the dual damascene vias.

The second objective of this invention is avoid the leakage defect, which is produced between the dual damascene vias, by using the metal layer to be the hard mask layer to make the surface of the isolation layer, which is between the dual damascene vias, become a level and smooth surface.

The third objective of this invention is to increase the process window in the back-end procedure by using the metal layer to be the hard mask layer to make the surface of the isolation layer, which is between the dual damascene vias, become a level and smooth surface.

The fourth objective of this invention is to increase the qualities of the semiconductor device by using the metal layer to be the hard mask layer to make the surface of the isolation layer, which is between the dual damascene vias, become a level and smooth surface.

The further objective of this invention is to decrease the cost of the procedure by using the metal layer to be the hard mask layer to make the surface of the isolation layer, which is between the dual damascene vias, become a level and smooth surface.

In according to the foregoing objectives, the present invention provides a method of forming the dual damascene via by using the metal layer to be the hard mask layer to make the surface of the isolation layer, which is between the dual damascene vias, become a level and smooth surface to avoid the bridging defect, which is produced between the dual damascene vias. The present invention will also avoid the leakage defect, which is produced between the dual damascene vias and to increase the width of the procedure in the back-end procedure. The present invention will further increase the qualities of the semiconductor device and decrease the cost of the procedure.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the intended advantages of this invention will become more readily appreciated as the same becomes better understood by reference to the following detailed description, when taken in conjunction with the accompanying drawings, wherein:

One such newer material is copper. The use of copper metallization improves performance and reliability over aluminum, but copper introduces additional problems that are difficult to overcome when using known techniques for aluminum. For example, in conventional aluminum inter-connective structures, a barrier layer is usually not required between the aluminum metal line and an $SiO_2$ inter-level dielectric (ILD). However, when copper is utilized, copper must be encapsulated from the surrounding ILD, since copper diffuses/drifts easily into the adjoining dielectric. Once the copper reaches the silicon substrate, it will significantly degrade the device's performance.

In order to encapsulate copper, a barrier layer of some sort is required to separate the copper from the adjacent material (s). Because copper encapsulation is a necessary step requiring a presence of a barrier material to separate the copper, other materials can now be substituted for the $SiO_2$ as the material for ILD. Replacing the $SiO_2$ by a low-dielectric constant material reduces the interline capacitance, thereby reducing the resistance capacitance (RC) delay, cross-talk noise and power dissipation in the inter-connective place. However, it is generally necessary to have a barrier (or liner) present between the inter-connective place and the low dielectric constant ILD to prevent possible interaction between the inter-connective place and the low-dielectric constant ILD and also to provide adhesion between them. This barrier is desirable even when aluminum is utilized for the inter-connective place.

Figure 1:
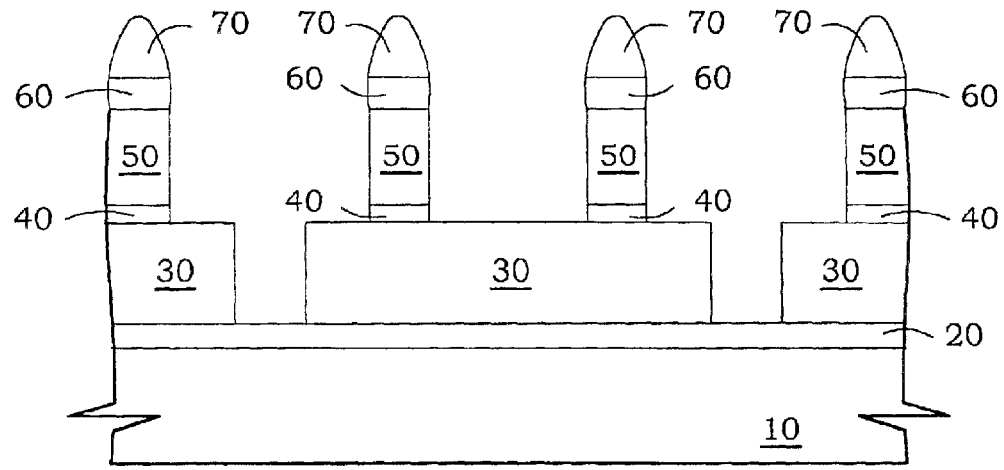
FIG. 1 shows a diagram in forming the shape of the dual damascene via by using the traditional method.
Figure 2:
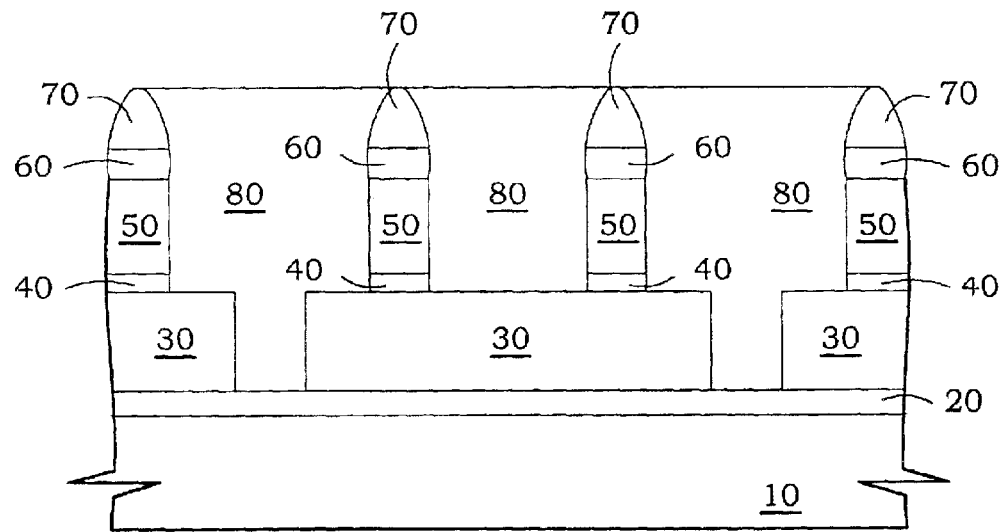
FIG. 2 shows a diagram in filling of the dual damascene via, which is formed by using the traditional method, by a metal layer and proceeding a chemical mechanical polishing procedure.
Figure 3:
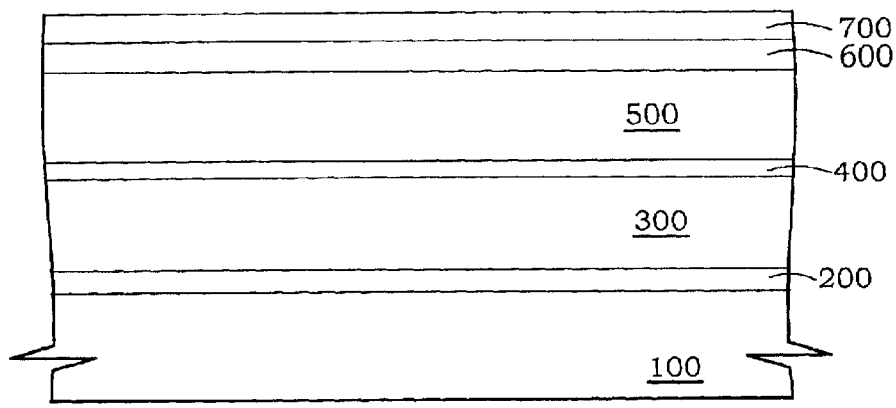
FIG. 3 shows a diagram in forming a cap layer, the first low dielectric constant dielectric layer, the middle etching stop layer, the second low dielectric constant dielectric layer, dielectric hard mask layer, and the second metal layer on the first metal layer.

Referring to FIG. 3, a wafer must be provided at first and the wafer comprises the first metal layer 100. Then a cap layer 200 is formed on the first metal layer 100 and the first low dielectric constant dielectric layer 300 is formed on the cap layer 200. The cap layer 200 is formed by using the chemical vapor deposition (CVD) procedure and the material of the cap layer 200 is silicon nitride (SiN) or silicon carbon (SiC). The thickness of the cap layer 200 is about 100 to 1000 angstroms. The low dielectric constant material, such as: oxide or fluorinated silicon dioxide (FSG), is most used to be the material of the first low dielectric constant dielectric layer 300. The thickness of the first low dielectric constant dielectric layer 300 is about 1000 to 5000 angstroms. Then a middle etching stop layer 400 is formed on the first low dielectric constant dielectric layer 300 and the second low dielectric constant dielectric layer 500 is formed on the middle etching stop layer 400. Silicon nitride or silicon carbon is most used to be the material of the middle etching stop layer 400 and the low dielectric constant material, such as: oxide or fluorinated silicon dioxide (FSG), is most used to be the material of the second low dielectric constant dielectric layer 500. The thickness of the middle etching stop layer is about 100 to 1000 angstroms and the thickness of the second low dielectric constant dielectric layer 500 is about 1000 to 5000 angstroms. At last, a dielectric hard mask layer 600 is formed on the second low dielectric constant dielectric layer 500 and the second metal layer 700 is formed on the dielectric hard mask layer 600. Silicon nitride or silicon carbon is most used to be the material of the dielectric hard mask layer 600. The second metal layer 700 is used to be a metal hard mask layer and is formed by using the chemical vapor deposition procedure or the physical vapor deposition procedure. Titanium, titanium nitride, tantalum, tantalum nitride, aluminum, or tungsten is most used to be the material of the second metal layer 700. The thickness of the dielectric hard mask layer 600 is about 100 to 1000 angstroms and the thickness of the second metal layer 700 is about 50 to 500 angstroms.

Figure 4:
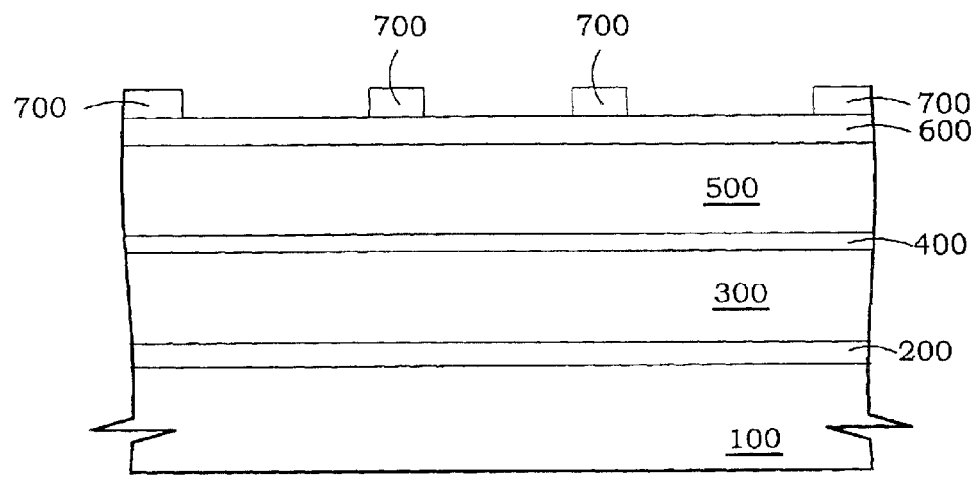
FIG. 4 shows a diagram in removing the partial second metal layer.
Figure 5:
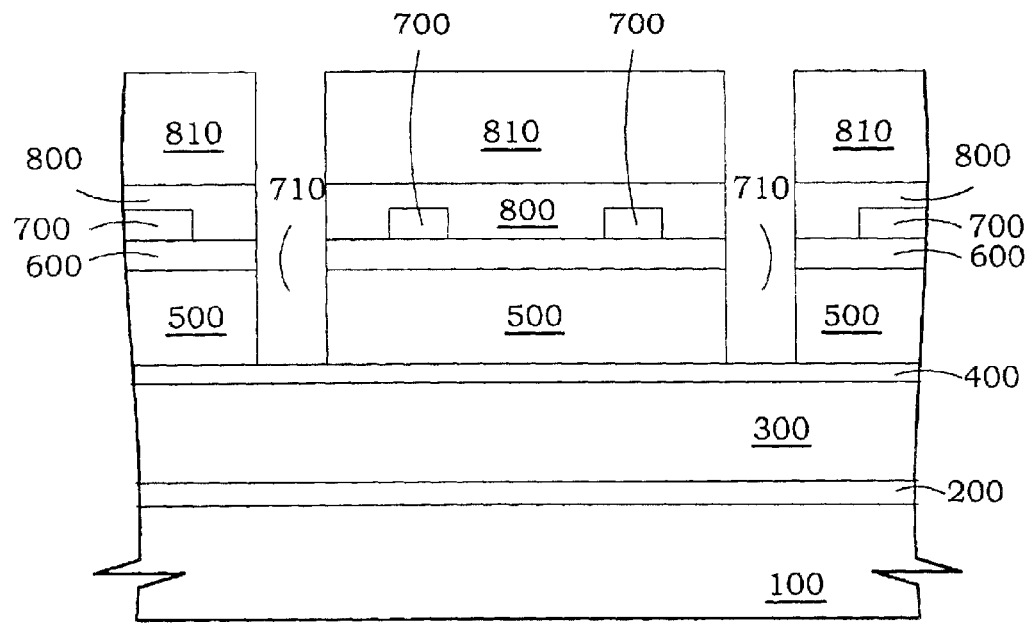
FIG. 5 shows a diagram in forming a bottom anti-reflective coating and a photo mask layer on the second metal layer and the partial dielectric hard mask layer and forming the first trench in the second low dielectric constant dielectric layer and the dielectric hard mask layer.
Figure 6:
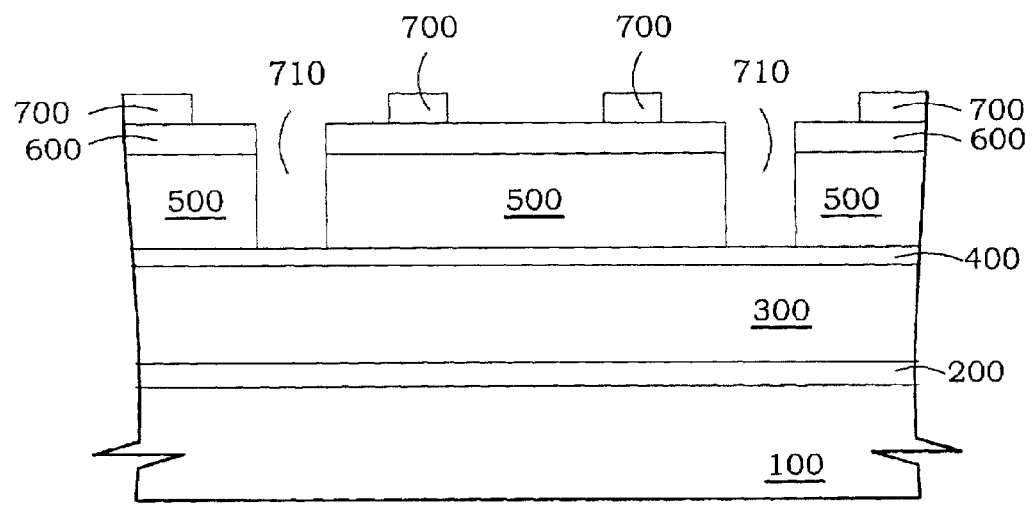
FIG. 6 shows a diagram in removing the bottom anti-reflective coating and a photo mask layer.

Referring to FIG. 4, after deciding the location of the isolation layer on the second metal layer 700, the partial second metal layer 700 is removed by using the photolithography and the etching procedure to form the second metal layer 700 on the isolation layer and expose the partial dielectric hard mask layer 600. Referring to FIG. 5, after deciding the location of the first trench 710 on the dielectric hard mask layer 600, a bottom anti-reflective coating 800 and a photo mask layer 810 are formed on the second metal layer 700 and the exposed dielectric hard mask layer. Following the needs of the procedure, sometimes the bottom anti-reflective coating 800 and the photo mask layer 810 may be omitted to increase the proceeding efficiency of the procedure. Then the partial dielectric hard mask layer 600 and the partial second low dielectric constant dielectric layer 500 are removed by using the photolithography and the etching procedure to form the first trench 710 in the dielectric hard mask layer 600 and the second low dielectric constant dielectric layer 500. The middle etching stop layer 400 is exposed at the bottom of the first trench 710. At last, the bottom anti-reflective coating 800 and the photo mask layer 810 are removed (referring to FIG. 6).

Figure 7:
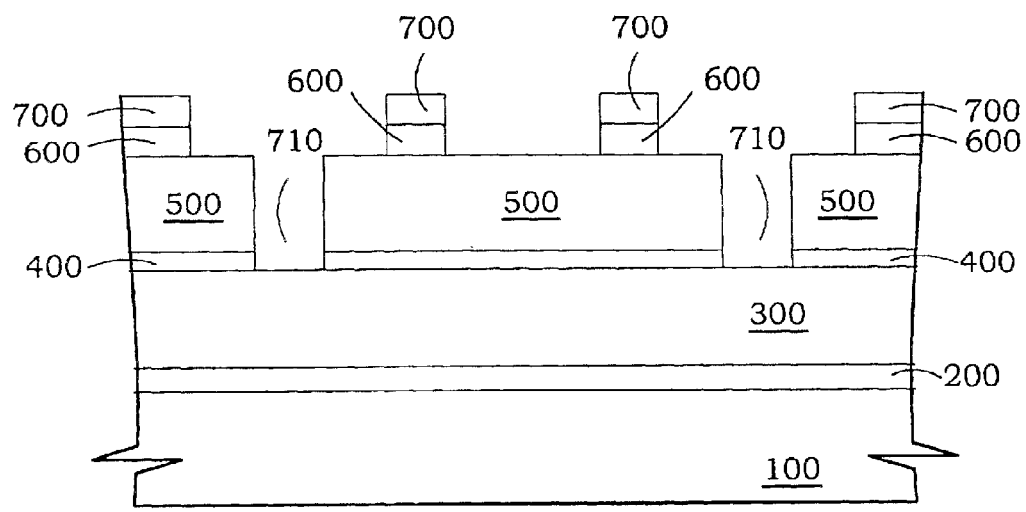
FIG. 7 shows a diagram in removing the partial dielectric hard mask layer and the middle etching stop layer which is at the bottom of the first trench.
Figure 8:
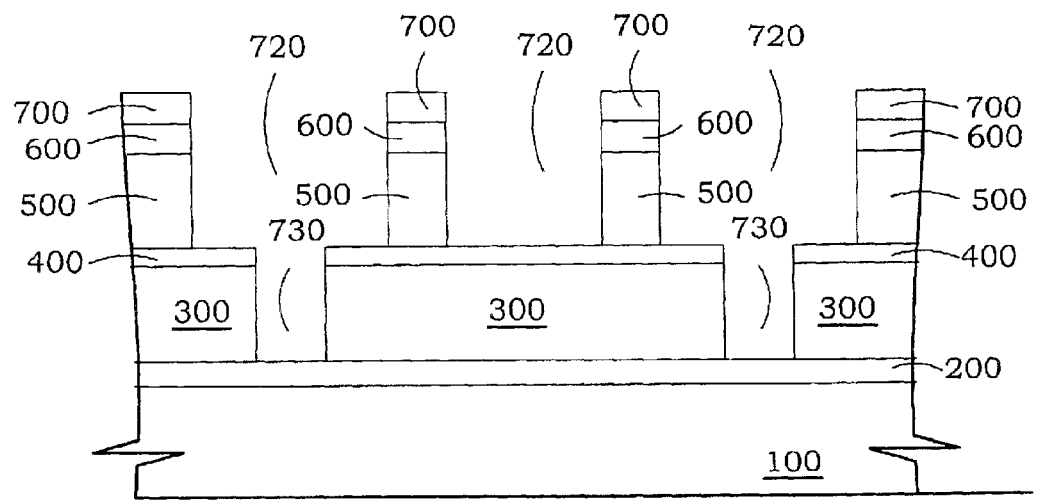
FIG. 8 shows a diagram in removing the partial first low dielectric constant dielectric layer and the partial second low dielectric constant dielectric layer to form the second trench in the second low dielectric constant dielectric layer and to form the third trench in the first low dielectric constant dielectric layer.

Referring to FIG. 7, the middle etching stop layer 400, which is at the bottom of the first trench 710, and the exposed dielectric hard mask layer 600 are removed by using the etching procedure after deciding the location of the second trench. The dielectric hard mask layer 600, which is on the isolation layer, will be protected by the second metal layer 700 and will not be removed in the etching procedure. Referring to FIG. 8, the partial second low dielectric constant dielectric layer 500 and the partial first low dielectric constant dielectric layer 300 are removed by using the etching procedure to form the second trench 720 in the second low dielectric constant dielectric layer 500, the dielectric mask layer 600, and the second metal layer 700 and to form the third trench 730 in the first low dielectric constant dielectric layer 300. The partial second trench 720 is connected with the third trench 730 to become the shape of the dual damascene via. The partial bottom of the second trench 720 exposes the middle etching stop layer 400 and the bottom of the third trench 730 exposes the cap layer 200.

Figure 9:
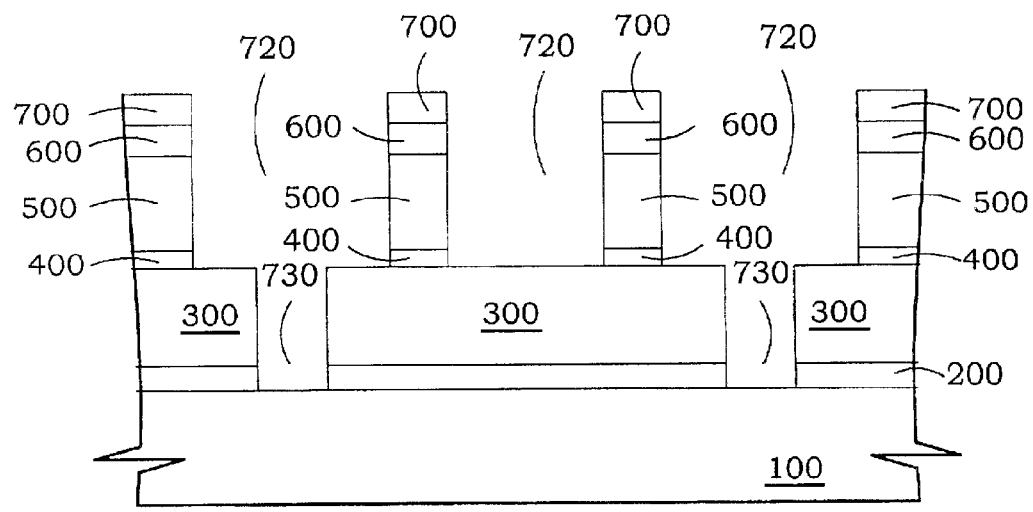
FIG. 9 shows a diagram in removing the middle etching stop layer, which is at the partial bottom of the second trench, and the cap layer, which is at the bottom of the third trench.

Referring to FIG. 9, the middle etching stop layer 400, which is at the partial bottom of the second trench 720, and the cap layer 200, which is at the bottom of the third trench 730 are removed by the etching procedure to expose the first low dielectric constant dielectric layer 300 at the partial bottom of the second trench 720 and to expose the first metal layer 100 at the bottom of the third trench 730. From FIG. 7 to FIG. 9, the properties of the second metal layer 700, which is used to be the metal hard mask layer, is different from the properties of the dielectric material, such as: dielectric hard mask layer 600, middle etching stop layer 400, the first low dielectric constant dielectric layer 300, and the second low dielectric constant dielectric layer 500, in the etching procedure. Therefore, the very high etching selective rate (>20) will be got among the second metal layer 700 and others dielectric materials in the etching procedure to make the surface of the second metal layer 700 become a level and smooth surface. This condition will avoid the surface of the second metal layer 700 to become the rounding profile because of the unenough etching selective rate.

Figure 10:
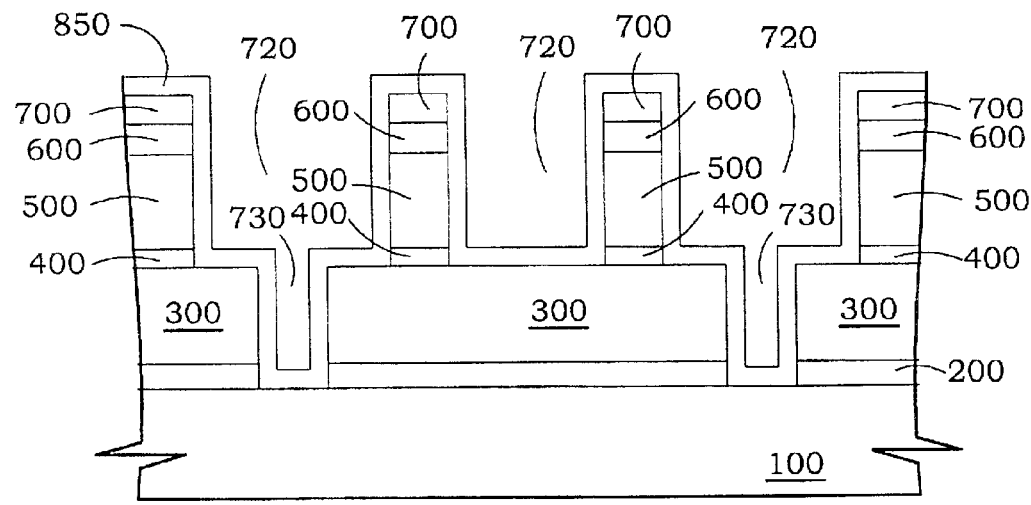
FIG. 10 shows a diagram in forming a barrier layer on the second metal layer, the sidewalls and the partial bottom of the second trench, and the sidewalls and the bottom of the third trench.
Figure 11:
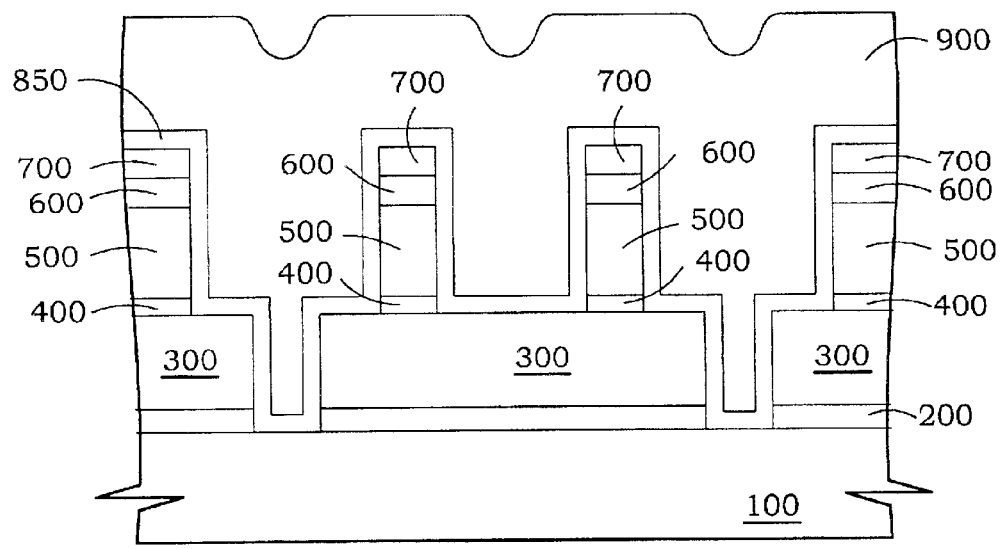
FIG. 11 shows a diagram in forming the third metal layer on the barrier layer and filling of the second trench and the third trench.

Referring to FIG. 10, a barrier layer 850 is formed on the sidewalls and the partial bottom of the second trench 720, the sidewalls and the bottom of the third trench 730, and the second metal layer 700. Tantalum nitride/tantalum or titanium nitride/titanium is most used to be the material of the barrier layer 850. Referring to FIG. 11, the third metal layer 900 is formed on the barrier layer 850 and is filled in the second trench 720 and the third trench 730 to the full. Aluminum or copper is most used to be the material of the third metal layer 900. In the embodiment, copper is used to be the material of the third metal layer 900 and the scope of the present invention is not limited. The copper layer is deposited on the barrier layer 850 by using the copper electroplating procedure to be the third metal layer 900.

Figure 12:
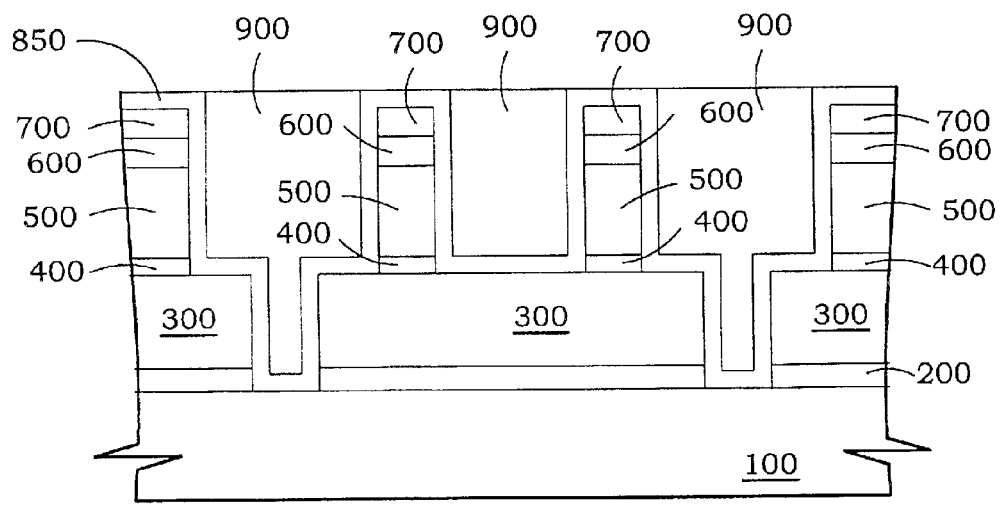
FIG. 12 shows a diagram in removing the partial third metal layer by using the chemical mechanical polishing procedure to expose the barrier layer, which is on the isolation layer.
Figure 13:
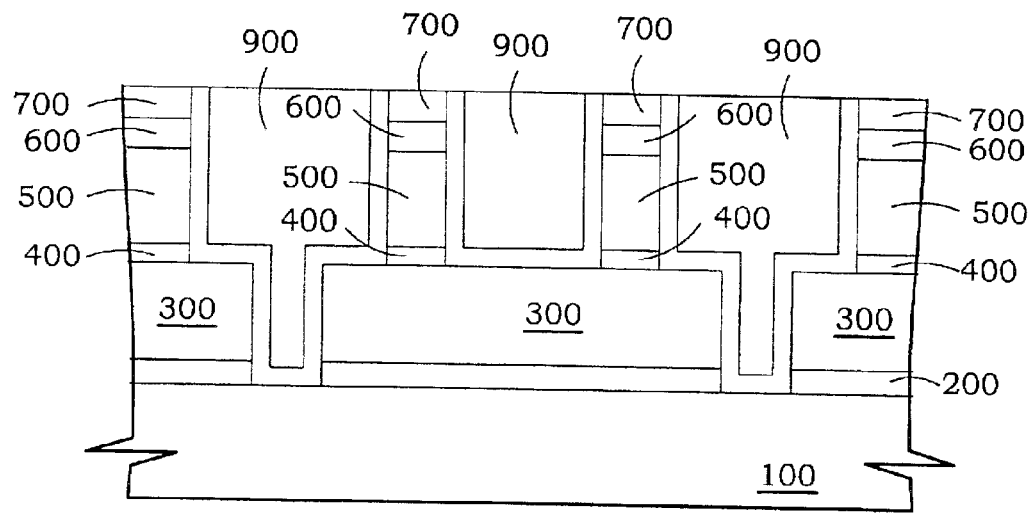
FIG. 13 shows a diagram in removing the partial barrier layer to expose the second metal layer, which is on the isolation layer.
Figure 14:
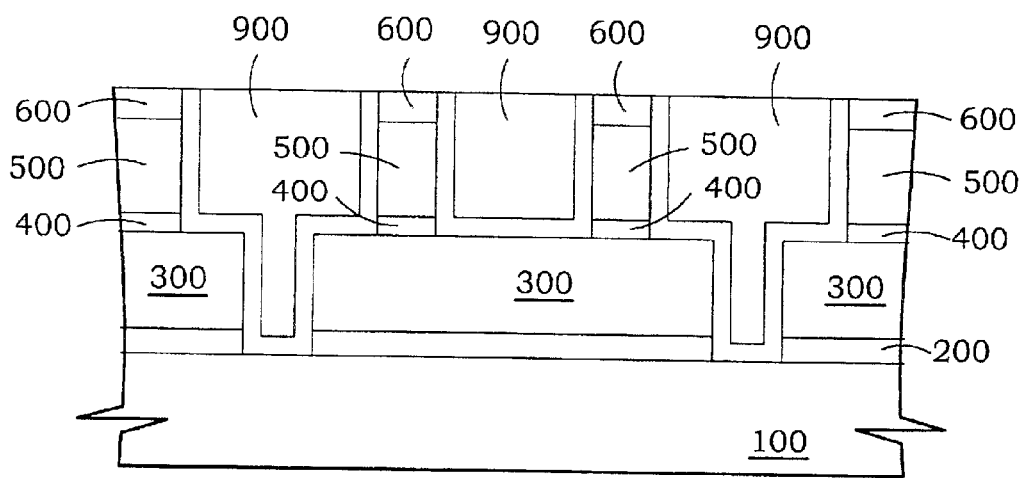
FIG. 14 shows a diagram in removing the second metal layer to expose the dielectric hard mask layer, which is on the isolation layer.

Referring to FIG. 12, the partial third metal layer 900 is removed by using the chemical mechanical polishing procedure to expose the barrier layer 850 on the isolation layer and to make the surface of the third metal layer 900 and the barrier layer 850 become a level and smooth surface. Because the present invention uses the second metal layer 700 to be the hard mask layer. Therefore, the process window of the chemical mechanical polishing procedure will be more enough and the bridging defect will not be produced at the place between the dual damascene vias to avoid the leakage defects. Referring to FIG. 13, the barrier layer 850 is removed by using the chemical mechanical polishing procedure or the etching procedure. Referring to FIG. 14, the second metal layer 700 is removed by using the chemical mechanical polishing procedure or the etching procedure and the dual damascene procedure is finished. The second metal layer 700 and the barrier layer 850 can be removed at the same time in the same procedure, such as: the chemical mechanical polishing procedure or the etching procedure.

In accordance with the present invention, the present invention provides a method of forming the dual damascene via by using the metal layer to be the hard mask layer to make the surface of the isolation layer, which is between the dual damascene vias, become a level and smooth surface to avoid the bridging defect, which is produced between the dual damascene vias. The present invention will also avoid the leakage defect, which is produced between the dual damascene vias and to increase the process window in the back-end procedure. The present invention will further increase the qualities of the semiconductor device and decrease the cost of the procedure.

Although specific embodiments have been illustrated and described, it will be obvious to those skilled in the art that various modifications may be made without departing from what is intended to be limited solely by the appended claims.

What is claimed is:

1. a method of forming a dual damascene via, said method comprises:

providing a wafer, wherein said wafer comprises a first metal layer;

forming a cap layer on said first metal layer;

forming a first dielectric constant dielectric layer on said cap layer;

forming a middle etching stop layer on said first dielectric constant dielectric layer;

forming a second dielectric constant dielectric layer on said middle etching stop layer;

forming a dielectric hard mask layer on said second dielectric constant dielectric layer;

forming a second metal layer on said dielectric hard mask layer;

removing a part of said second metal layer to form a metal hard mask layer on said dielectric hard mask layer;

forming a photo mask layer on said second metal layer and said dielectric hard mask layer;

removing a part of said dielectric hard mask layer and a part of said second dielectric constant dielectric layer to form a first trench in said dielectric hard mask layer and said second dielectric constant dielectric layer;

removing said photo mask layer;

removing said middle etching stop layer which is at a bottom of said first trench and said dielectric hard mask layer;

removing a part of said second dielectric constant dielectric layer to form a second trench in said second dielectric constant dielectric layer and removing a part of said first dielectric constant dielectric layer to form a third trench in said first dielectric constant dielectric layer, wherein said second trench and said third are connected with each other;

removing said cap layer which is at a bottom of said third trench and removing said middle etching stop layer which is at a partial bottom of said second trench;

forming a third metal layer on said second metal layer and in said second trench and said third trench and filling of said second trench and said third trench; and removing a part of said third metal layer to expose said second metal layer and making a surface of said third metal layer and said metal layer become a planar surface.

2. The method according to claim 1, wherein said second metal layer is titanium.

3. The method according to claim 1, wherein said second metal layer is titanium nitride.

4. The method according to claim 1, wherein said second metal layer is tantalum.

5. The method according to claim 1, wherein said second metal layer is tantalum nitride.

6. The method according to claim 1, wherein said second metal layer is aluminum.

7. The method according to claim 1, wherein said second metal layer is tungsten.

8. The method according to claim 1, wherein said middle etching stop layer is silicon nitride.

9. The method according to claim 1, wherein said middle etching stop layer is silicon carbon.

10. a method of forming a dual damascene via, said method comprises:

providing a wafer, wherein said wafer comprises a first metal layer;

forming a cap layer on said first metal layer;

forming a first dielectric constant dielectric layer on said cap layer;

forming a middle etching stop layer on said first dielectric constant dielectric layer;

forming a second dielectric constant dielectric layer on said middle etching stop layer;

forming a dielectric hard mask layer on said second dielectric constant dielectric layer forming a second metal layer on said dielectric hard mask layer;

removing a part of said second metal layer to form a metal hard mask layer on said dielectric hard mask layer;

forming a bottom anti-reflective coating on said second metal layer and said dielectric hard mask layer;

forming a photo mask layer on said bottom anti-reflective coating;

removing a part of said dielectric hard mask layer and a part of said second dielectric constant dielectric layer to form a first trench in said dielectric hard mask layer and said second dielectric constant dielectric layer;

removing said bottom anti-reflective coating and said photo mask layer;

removing said middle etching stop layer which is at a bottom of said first trench and said dielectric hard mask layer;

removing another part of said second dielectric constant dielectric layer to form a second trench in said second dielectric constant dielectric layer and removing a part of said first dielectric constant dielectric layer to form a third trench in said first dielectric constant dielectric layer, wherein said second trench and said third are connected with each other;

removing said cap layer which is at a bottom of said third trench and removing said middle etching stop layer which is at a partial bottom of said second trench;

forming a barrier layer on said second metal layer, said partial bottom of said second trench, a sidewall of said second trench, said bottom of said third trench, and a sidewall of said third trench;

forming a third metal layer on said barrier layer and in said second trench and said third trench and filling of said second trench and said third trench; and removing a part of said third metal layer to expose said second metal layer and making a surface of said third metal layer and said metal layer become a planar surface.

11. The method according to claim 10, wherein said second metal layer is titanium.

12. The method according to claim 10, wherein said second metal layer is titanium nitride.

13. The method according to claim 10, wherein said second metal layer is tantalum.

14. The method according to claim 10, wherein said second metal layer is tantalum nitride.

15. The method according to claim 10, wherein said second metal layer is aluminum.

16. The method according to claim 10, wherein said second metal layer is tungsten.

17. The method according to claim 10, wherein said middle etching stop layer is silicon nitride.

18. The method according to claim 10, wherein said middle etching stop layer is silicon carbon.

19. The method according to claim 10, wherein a material of said third metal layer is copper.

20. The method according to claim 10, wherein said barrier layer is tantalum nitride/tantalum.

21. The method according to claim 10, wherein said barrier layer is titanium nitride/titanium.

22. a method of forming a dual damascene via, said method comprises:

providing a wafer, wherein said wafer comprises a first metal layer;

forming a cap layer on said first metal layer;

forming a first dielectric constant dielectric layer on said cap layer;

forming a middle etching stop layer on said first dielectric constant dielectric layer;

forming a second dielectric constant dielectric layer on said middle etching stop layer;

forming a dielectric hard mask layer on said second dielectric constant dielectric layer forming a second metal layer on said dielectric hard mask layer;

removing a part of said second metal layer to form a metal hard mask layer on said dielectric hard mask layer;

forming a bottom anti-reflective coating on said second metal layer and said dielectric hard mask layer;

forming a photo mask layer on said bottom anti-reflective coating;

removing a part of said dielectric hard mask layer and a part of said second dielectric constant dielectric layer to form a first trench in said dielectric hard mask layer and said second dielectric constant dielectric layer;

removing said bottom anti-reflective coating and said photo mask layer;

removing said middle etching stop layer which is at a bottom of said first trench and said dielectric hard mask layer;

removing another part of said second dielectric constant dielectric layer to form a second trench in said second dielectric constant dielectric layer and removing a part of said first dielectric constant dielectric layer to form a third trench in said first dielectric constant dielectric layer, wherein said second trench and said third are connected with each other;

removing said cap layer which is at a bottom of said third trench and removing said middle etching stop layer which is at a partial bottom of said second trench;

forming a barrier layer on said second metal layer, said partial bottom of said second trench, a sidewall of said second trench, said bottom of said third trench, and a sidewall of said third trench;

forming a copper layer on said barrier layer and in said second trench and said third trench and filling of said second trench and said third trench;

removing a part of said copper layer to expose said second metal layer and making a surface of said third metal layer and said metal layer become a planar surface;

removing said barrier layer which is on said second metal layer to expose said second metal layer; and removing said second metal layer which is on said dielectric hard mask layer to expose said dielectric hard mask layer.

23. The method according to claim 22, wherein said second metal layer is titanium.

24. The method according to claim 22, wherein said second metal layer is titanium nitride.

25. The method according to claim 22, wherein said second metal layer is tantalum.

26. The method according to claim 22, wherein said second metal layer is tantalum nitride.

27. The method according to claim 22, wherein said second metal layer is aluminum.

28. The method according to claim 22, wherein said second metal layer is tungsten.

29. The method according to claim 22, wherein said middle etching stop layer is silicon nitride.

30. The method according to claim 22, wherein said middle etching stop layer is silicon carbon.

31. The method according to claim 22, wherein a material of said third metal layer is copper.

32. The method according to claim 22, wherein said barrier layer is tantalum nitride/tantalum.

33. The method according to claim 22, wherein said barrier layer is titanium nitride/titanium.

34. The method according to claim 22, wherein said dielectric hard mask layer is silicon carbon.

35. The method according to claim 22, wherein said dielectric hard mask layer is silicon nitride.

36. The method according to claim 22, wherein a thickness of said second metal layer is about 50 to 500 angstroms.

* * * * *